US012787346B2

(12) United States Patent
Yoon

(10) Patent No.: US 12,787,346 B2
(45) Date of Patent: Nov. 3, 2026

(54) SEMICONDUCTOR DEVICE AND METHOD FOR FABRICATING THE SAME

(71) Applicant: SK hynix Inc., Gyeonggi-do (KR)

(72) Inventor: Young Gwang Yoon, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 374 days.

(21) Appl. No.: 18/502,084

(22) Filed: Nov. 6, 2023

(65) Prior Publication Data

US 2024/0072171 A1 Feb. 29, 2024

Related U.S. Application Data

(63) Continuation of application No. 17/463,240, filed on Aug. 31, 2021, now Pat. No. 11,848,383.

(30) Foreign Application Priority Data

Feb. 4, 2021 (KR) ........................ 10-2021-0016266

(51) Int. Cl.

*H10D 30/62* (2025.01)
*H10D 30/01* (2025.01)
*H10D 62/822* (2025.01)
*H10D 84/01* (2025.01)
*H10D 84/03* (2025.01)
*H10D 84/85* (2025.01)
*H10W 10/00* (2026.01)
*H10W 10/17* (2026.01)

(52) U.S. Cl.

CPC ....... *H10D 30/6211* (2025.01); *H10D 30/024* (2025.01); *H10D 62/822* (2025.01);

(Continued)

(58) Field of Classification Search

CPC .. H10D 30/6211; H10D 30/62; H10D 30/797; H10D 64/017; H10D 84/0151;

(Continued)

(56) References Cited

U.S. PATENT DOCUMENTS 10,056,289 B1 8/2018 Cheng et al.
2010/0015778 A1 1/2010 Lin et al.

(Continued)

FOREIGN PATENT DOCUMENTS

CN 103855215 A 6/2014
KR 10-2019-0037054 A 4/2019
KR 10-2019-0038401 A 4/2019

OTHER PUBLICATIONS

Notice of Allowance (=Notification to Grant Patent Right for Invention) for Korean Patent Application No. 10-2021-0016266 issued by the Korean Patent Office on Aug. 18, 2025.

(Continued)

*Primary Examiner* — Fernando L Toledo
*Assistant Examiner* — Adam S Bowen
(74) *Attorney, Agent, or Firm* — IP&T GROUP LLP

(57) ABSTRACT

Various embodiments of the present invention are to provide a semiconductor device and a method for fabricating the same and, more particularly, to a semiconductor device including isolation layers including an air gap, thereby minimizing stress to a substrate caused by oxide and improving performance of a device, and a method for fabricating the same. The semiconductor device according to the embodiment of the present invention comprises: a plurality of isolation layers each including a trench formed in a substrate and an air gap in a lower portion of the trench; an active region including a fin body disposed between the isolation layers, which are consecutively disposed, and a fin formed on the fin body, the fin having a narrower width than the fin body and extending in a first direction; a gate structure partially covering the active region and the isolation layers, and extending in a second direction; and a source/drain region covering the fin on both sides of the gate structure.

19 Claims, 15 Drawing Sheets

(52) U.S. Cl.
CPC ..... *H10D 84/0188* (2025.01); *H10D 84/0193* (2025.01); *H10D 84/038* (2025.01); *H10D 84/853* (2025.01); *H10W 10/014* (2026.01); *H10W 10/17* (2026.01)

(58) Field of Classification Search
CPC ... H10D 84/017; H10W 10/014; H10W 10/17
See application file for complete search history.

(56) References Cited

U.S. PATENT DOCUMENTS

| | | | | |
|---|---|---|---|---|
| 2011/0180847 | A1 | 7/2011 | Ikeda et al. | |
| 2014/0315371 | A1 | 10/2014 | Cai et al. | |
| 2019/0027599 | A1 | 1/2019 | Anderson et al. | |
| 2019/0067111 | A1* | 2/2019 | Tsai | H10D 84/0158 |
| 2019/0109217 | A1 | 4/2019 | Lin et al. | |
| 2020/0118867 | A1* | 4/2020 | Lin | H10D 30/62 |
| 2021/0020517 | A1 | 1/2021 | Tsai et al. | |

OTHER PUBLICATIONS

Office Action for Korean Patent Application No. 10-2021-0016266 issued by the Korean Patent Office on Nov. 13, 2024.
Office Action for Chinese Patent Application No. 202210100414.6 issued by the Chinese Patent Office on Jan. 15, 2026.

* cited by examiner

SEMICONDUCTOR DEVICE AND METHOD FOR FABRICATING THE SAME

CROSS-REFERENCE TO RELATED APPLICATIONS

The present application is a continuation of U.S. patent application Ser. No. 17/463,240 filed on Aug. 31, 2021, which claims priority to Korean Patent Application No. 10-2021-0016266, filed on Feb. 4, 2021, which is herein incorporated by reference in its entirety.

BACKGROUND

1. Field

The present invention relates to a semiconductor device and a method for fabricating the same. More particularly, the present invention relates to a semiconductor device including isolation layers including an air gap and fin structures made of different materials, and a method for fabricating the same.

2. Description of the Related Art

As a semiconductor device is integrated, the length of a gate becomes short as well as the length of channels which are formed under the gate. Therefore, various efforts are being made to improve the structures and fabrication methods of a semiconductor device so as to improve operational stability and reliability of transistors, which are important factors determining the performance of integrated circuits.

SUMMARY

Various embodiments of the present disclosure are to provide a semiconductor device capable of minimizing the stress to a substrate caused by oxide. The semiconductor device may include a isolation layer having an air gap. The semiconductor device may exhibit improved performance including improved operational stability and reliability.

According to an embodiment of the present invention, a semiconductor device comprises a plurality of isolation layers each including a trench formed in a substrate and an air gap in a lower portion of the trench, an active region including a fin body disposed between the isolation layers, which are consecutively disposed, and a fin formed on the fin body, the fin having a narrower width than the fin body and extending in a first direction, a gate structure partially covering the active region and the isolation layers, and extending in a second direction, and a source/drain region covering the fin on both sides of the gate structure.

According to another embodiment, a method for fabricating a semiconductor device comprises forming a stacked structure of a fin and a sacrificial pattern on a substrate, forming sacrificial spacers on both sides of the stacked structure, forming a dividing trench by etching an exposed portion of the substrate between the sacrificial spacers, which are consecutively disposed, and forming a isolation layer in the dividing trench, the isolation layer including an air gap and a capping layer.

An effect of the present invention includes improving the reliability of the semiconductor device by preventing mobility deterioration and stress relaxation of the semiconductor device.

These and other features and advantages of the present invention will become clearer and better understood to the person having ordinary skill in the art from the following detailed description and drawings.

DETAILED DESCRIPTION

Figure 1A:
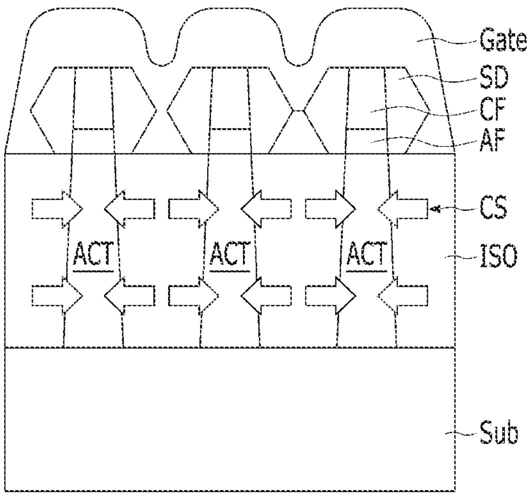
FIGS. 1A and 1B are diagrams illustrating device deterioration caused by a material buried in a isolation layer.

Various embodiments of the present invention will be described with reference to cross-sectional views, plane views and block diagrams, which are ideal schematic views of examples of the present invention. The structures of the drawings may be modified without departing from the scope of the invention, for example, because of fabricating technology requirements, tolerances and the like. The embodiments of the present invention may not be limited to the specific structures shown in the drawings, and may include any changes in the structures that may be produced according to the fabricating process. Also, any regions and shapes of regions illustrated in the drawings with schematic views, are intended to illustrate specific examples of structures of regions of the various elements, and are not intended to limit the scope of the invention.

The present disclosure discloses an embodiment of the present invention having a form of multi-gate transistors or fin-type multi-gate transistors which is also referred to herein as a Fin field-effect transistor (FinFET) device. Such a device may include a P-type metal oxide semiconductor FinFET device or an N-type metal oxide semiconductor FinFET device. The FinFET device may be of a double gate device, a triple gate device, a bulk device, a silicon on insulator (SOI) device, and/or other configurations. Those skilled in the art can recognize other embodiments of useful semiconductor devices which may fall within the scope of the present invention. For example, embodiments described herein may also be applied to a gate all around (GAA) device, an omega (Q-gate) gate device, or a Pi gate (n-gate) device.

Figure 1B:
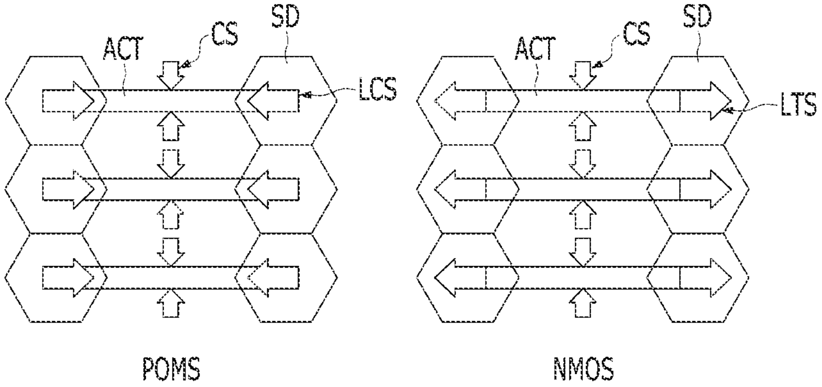

FIGS. 1A and 1B are diagrams illustrating device deterioration caused by a material buried in a isolation layer. FIG. 1A is a cross-sectional view showing stress directions of a material buried in the isolation layer. FIG. 1B is a plane view illustrating an effect of stress directions of a material buried in a source/drain region and a isolation layer in PMOS and NMOS regions.

As shown in FIGS. 1A and 1B, an active region ACT extending in a first direction may be defined by a isolation layer ISO, which may be formed on a substrate Sub. The active region ACT may include an active fin AF protruding above the isolation layer ISO. An upper surface of the active fin AF may be positioned at a level higher than an upper surface of the isolation layer ISO. A channel fin CF may be formed on the active fin AF of the active region ACT. The active fin AF may be formed by etching a portion of the substrate Sub, and the channel fin CF may be formed by depositing and etching a separate layer on the substrate Sub. A gate Gate extending in a second direction vertical to the first direction while crossing the active region ACT is formed on the channel fin CF. Source/drain regions SD are formed on the active fins AF and the channel fins CF, the active fins AF and the channel fins CF being positioned at both sides of the gate. SiGe (silicon-germanium) may be applied to the channel fin CF and the source/drain region SD of the PMOS FinFET device, and SiC (silicon-carbide) may be applied to the channel fin CF and the source/drain region SD of the NMOS FinFET device.

The active region ACT is defined through a series of processes in which a trench is formed by etching the substrate Sub, and then an oxide is gap-filled in the trench to form a isolation layer ISO. The channel fin CF is used as a gate channel through ion implantation of an impurity. Ion implantation for forming the gate channel is performed before the gate is formed.

During the ion implantation for forming the gate channel, impurities for controlling the threshold voltage Vt are also unnecessarily doped at the interface between the active fin AF and the active region ACT adjacent to the active fin AF. Thus, mobility may be deteriorated. In addition, when a metal gate is applied as a gate, thermal stability issues may arise due to the diverse types of metal materials.

In addition, since sufficient stress cannot be applied to the device due to a compressive stress LCS of the gap-filled oxide which was used to form the device isolation layer ISO, device performance may deteriorate. In other words, in PMOS, SiGe is applied to the source/drain regions and the compressive stress LCS is applied, and in NMOS, SiC is applied to the source/drain regions and tensile stress LTS is applied, thereby improving carrier mobility and current driving capability. Although there is an effect of improving the capability, stress applied to the PMOS and NMOS is relieved due to the oxide gap-filled in the isolation layer ISO. For example, the oxide gap-filled in the device isolation layer ISO applies a continuous compressive stress CS to the active region ACT in a vertical direction to the direction of the stress applied in the source/drain regions of the PMOS and NMOS. However, since the stress applied to the PMOS and NMOS is relaxed, there is a problem in that it is difficult to apply sufficient stress to the PMOS and NMOS to improve the current driving capability.

Accordingly, in this embodiment, a semiconductor device capable of improving the current driving capability by applying sufficient tensile stress or compressive stress to both the PMOS and the NMOS of the FinFET device and a method for fabricating the same will be disclosed.

Figure 2:
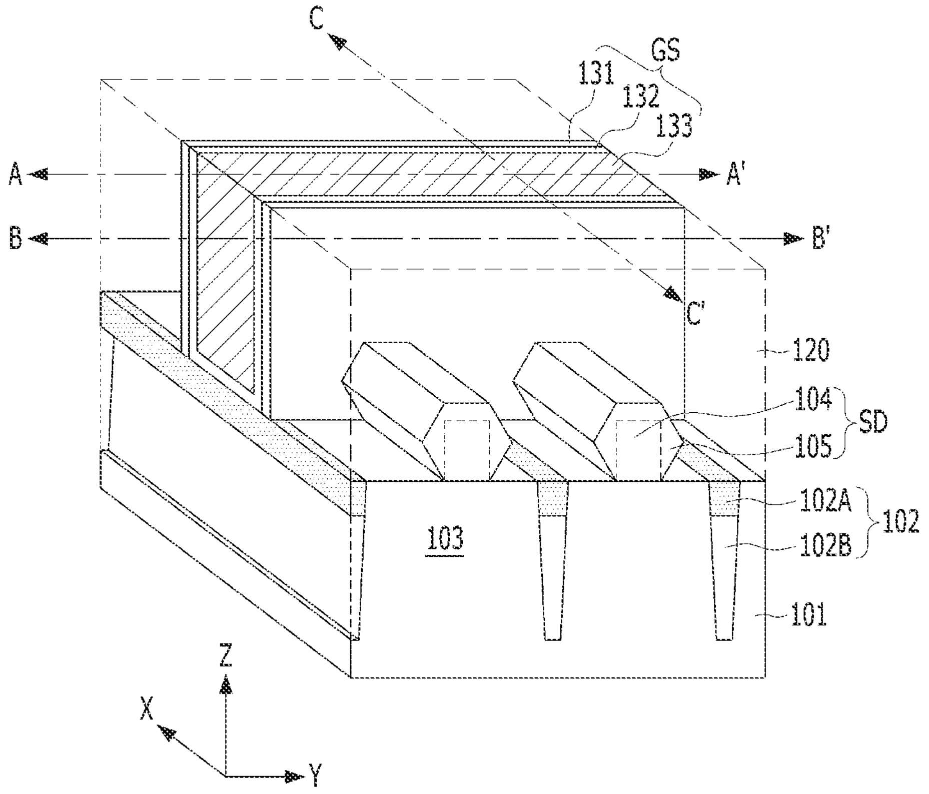
FIG. 2 is a perspective view illustrating a semiconductor device according to an embodiment of the present invention.

FIG. 2 is a perspective view illustrating a semiconductor device according to an embodiment of the present invention.

As shown in FIG. 2, the semiconductor device may include one or more isolation layers 102 formed in a substrate 101, a fin body 103 defined by the isolation layers 102, an active region including a fin 104 formed on the fin body 103, a gate structure GS formed on an upper portion of the substrate 101, a source/drain region SD covering the fin 104 positioned at both sides of the gate structure GS and an interlayer dielectric layer 120 filling between the gate structures GS. The isolation layers 102 and the active region may extend in a first direction X, and the gate structure GS may extend in a second direction Y vertical to the first direction X. FIG. 2 shows two isolation layers 102 spaced apart from each other along the second direction Y. Two source/drain regions SD are also spaced apart from each other along the second direction Y.

The substrate 101 may include a semiconductor substrate such as a silicon substrate. The substrate 101 may be made of a silicon-containing material. The substrate 101 may include various doping configurations depending on design requirements. The substrate 101 may include other semiconductors such as germanium, silicon carbide (SiC), silicon germanium (SiGe), or diamond. The substrate 101 may include a compound semiconductor and/or an alloy semiconductor. The substrate 101 may include a III-V group semiconductor substrate. The substrate 101 may include a compound semiconductor substrate such as GaAs (Gallium Arsenide), InAs (Indium Arsenide), or InP (Indium Phosphide). The substrate 101 may include a silicon on insulator (SOI) substrate. The substrate 101 may include a conductive region such as a well and a channel in which an impurity is doped or a structure in which an impurity is doped.

The isolation layers 102 may be extended in the first direction X. The fin body 103 may be defined by the isolation layers 102. The isolation layers 102 may be spaced apart from each other along the second direction Y with the fin body 103 interposed therebetween. Widths of the isolation layers 102 may be narrower than that of the fin 104. The isolation layer 102 may have an extremely scaled critical dimension.

Each of the isolation layers 102 may include an air gap 102B and a capping layer 102A formed on the air gap 102B. Neighbouring fin bodies 103 may be sufficiently spaced from each other by forming the capping layers 102A gap-filling upper portions of the respective isolation layers 102 and by forming the air gaps 102B at lower portions of the respective isolation layers 102. The capping layer 102A may include an insulating material. The capping layer 102A may include oxide. The capping layer 102A may include a silicon oxide material having a bad step coverage. The capping layer 102A may include tetraethyl orthosilicate (TEOS)-based oxide. In another embodiment, the capping layer 102A may include undoped silicate glass (USG) oxide or high-density plasma (HDP) oxide.

The active region may include the fin body 103 and the fin 104 formed on the fin body 103.

The fin body 103 may be defined by the isolation layers 102. The fin body 103 may extend in the first direction X. The fin bodies 103 may be spaced apart from each other in the second direction Y with the isolation layers 102 interposed therebetween. The fin bodies 103 may have a width wider than that of the isolation layers 102. The upper surface of the fin body 103 may be positioned at the same level as the upper surface of the isolation layers 102. The fin 104 may protrude in a third direction Z vertical to the upper surface of the substrate 101. The upper surface of the fin 104 may be at a higher level than the upper surfaces of the fin body 103 and the isolation layers 102. The fin 104 may have a narrower width than the fin body 103. The fin 104 may have a wider width than the isolation layer 102. The fin 104 may be formed of a material different from the fin body 103. The fin 104 may be a separate layer from the fin body 103. The fin 104 may be formed directly on the fin body 103.

The fin 104 may be formed of a germanium (GE)-based semiconductor material or a tin (Sn)-based semiconductor material. The stacked structure of the fin 104/fin body 103 may include one of stacked structures from SiGe/Si, Ge/Si, or high concentration SiGe/low concentration SiGe. In another embodiment, the stacked structure of the fin 104/fin body 103 may include a stacked structure of GeSn/Ge or Sn/Ge.

The gate structure GS may be formed on the upper portion of the substrate 101. The gate structure GS may extend in the second direction Y. The gate structure GS may have a line shape extending in the second direction Y. Consecutively disposed gate structures GS may be separated from each other by the interlayer dielectric layer 120. The gate structure GS may cover a part of the respective fin bodies 103, the fins 104, and the isolation layers 102. The gate structure GS may directly contact the substrate 101. The upper surface of the gate structure GS may be at a higher level than the upper surface of the fin body 103 and the upper surface of the fin 104.

The gate structure GS may include a gate spacer 131, a gate dielectric layer 132, and a gate electrode 133.

The gate dielectric layer 132 may be disposed between the gate electrode 133 and the fin body 103. The gate dielectric layer 132 may be disposed between the gate electrode 133 and the fin 104. The gate dielectric layer 132 may extend between the gate electrode 133 and the isolation layers 102. The gate dielectric layer 132 may extend between the gate electrode 133 and the gate spacer 131. The upper surface of the gate dielectric layer 132 may be at the same level as the upper surface of the gate electrode 133. The gate dielectric layer 132 may directly contact the substrate 101.

The gate dielectric layer 132 may include a high dielectric (high-k) material, for example, such as hafnium oxide ($HfO_2$). The gate dielectric layer 132 may include a selected one or a combination of selected ones from among hafnium silicate ($HfSiO_4$), zirconium oxide ($ZrO_2$), zirconium silicate ($ZrSiO_4$), titanium oxide ($TiO_2$), HfZrO, and tantalum oxide ($Ta_2O_3$). Alternatively, the gate dielectric layer 132 may include a high-k material including other suitable materials. In another embodiment, the gate dielectric layer 132 may include silicon oxide or other suitable dielectric materials. The gate dielectric layer 132 may be formed by atomic layer deposition (ALD), physical vapor deposition (PVD), oxidation, and/or other suitable methods.

In another embodiment, an interface layer may be interposed between the gate dielectric layer 132 and the substrate 101. The interface layer may include a dielectric material such as silicon oxide or silicon nitride.

The gate electrode 133 may include a conductive material.

The gate electrode 133 may include a metal. The gate electrode 133 may include a conductive metal or conductive nitride. The gate electrode 133 may include a conductive material such as W, TiN, TaN, WN, Re, Ir, Ru, Mo, Al, Cu, Co, Ni, or a combination thereof, and/or other suitable compositions. The gate electrode 133 may include a first metal for an N-type FinFET and a second metal for a P-type FinFET depending on the substrate 101. In another embodiment, the gate electrode 133 may include polysilicon. The gate electrode 133 may be formed by physical vapor deposition (PVD), chemical vapor deposition (CVD), and/or other suitable processes.

The gate spacer 131 may be formed on both sidewalls of the gate structure GS. The gate spacer 131 may be spaced apart from the gate electrode 133 with the gate dielectric layer 132 interposed therebetween. The gate spacer 131 may include a dielectric material such as silicon oxide, silicon nitride, silicon carbide, silicon oxynitride, or a combination thereof.

The source/drain region SD may cover the fin 104 on both sides of the gate structure GS. The source/drain region SD may cover a side surface and an upper surface of the fin 104. The bottom surface of the source/drain region SD may be lower than the top surface of the fin 104. The upper surface of the source/drain region SD may be at a higher level than the upper surface of the fin 104.

The source/drain region SD may include the fin 104 and an epitaxial layer 105 grown from the fin 104. The source/drain regions SD may be spaced apart from each other with the gate structure GS interposed therebetween. The epitaxial layer 105 may include the same material as the fin 104. The epitaxial layer 105 may be formed through selective epitaxial growth (SEG). The epitaxial layer 105 may include one of SiGe, Ge, GeSn, or Sn.

The source/drain regions SD may further include impurities doped in the fin 104 and the epitaxial layer 105. The source/drain regions SD may contain different impurities in the PMOS region and the NMOS region, respectively. The source/drain region SD of the PMOS region may include one of B, BF2, or Ga impurities. The source/drain region SD of the NMOS region may include impurities such as As and/or Sb. In another embodiment, the epitaxial layer 105 of the NMOS region may further include additional impurities through insitu doping during epitaxial growth. The epitaxial layer 105 of the NMOS region may include one of SiC, SiCP, or SiP.

The interlayer dielectric layer 120 may be formed to cover the source/drain region SD around the gate structure GS. The interlayer dielectric layer 120 may be formed to fill a space between adjacent gate structures GS. The interlayer dielectric layer 120 may include a single insulating material or a plurality of insulating materials. The upper surface of the interlayer dielectric layer 120 may be at the same level as the upper surface of the gate structure GS. In another embodiment, the interlayer dielectric layer 120 may be at a higher level than the gate structure GS.

As described above, in the present embodiment, by minimizing the insulating material filling the isolation layer 102, the application of unnecessary stress from the insulating material to the substrate 101, more specifically to the fin body 103, may be minimized. In addition, by forming the width of the isolation layers 102 to be narrower than that of the fin body 103, the overall volume of the fin body 103 may be increased. Accordingly, there is an effect of dispersing the stress applied to the fin body 103 from the capping layer 102A of the isolation layers 102.

In addition, in this embodiment, by forming the fin 104 on the fin body 103 through a separate deposition process, only the fin 104 may protrude above the substrate 101. Accordingly, it is possible to minimize the effect on the fin body 103 and the fin 104 resulting from different stress characteristics of the fin body 103 and the fin 104 which are made of different materials. That is, it is possible to minimize a problem in which the stress of the fin 104 acting as the source/drain region SD is relieved by a material of the fin body 103 or an impurity unnecessarily doped into the fin body 103.

Accordingly, in the present embodiment, a high-performance device can be implemented by applying sufficient stress required to improve device performance.

FIGS. 3A to 3L are cross-sectional views illustrating a method for fabricating a semiconductor device according to an embodiment of the present invention. In FIGS. 3A to 3L, A-A' is a cross-sectional view taken along the line A-A' of FIG. 2 crossing the gate structure GS in the first direction X, B-B' is a cross-sectional view taken B-B' of FIG. 2 crossing the interlayer dielectric layer 120 in the first direction X, and C-C' is a cross-sectional view taken along the line C-C' of FIG. 2 crossing the isolation layer SD in the second direction Y. Among the components shown in FIGS. 3A to 3L, components having the same names as those shown in FIG. 2 may be made of the same material as the components shown in FIG. 2. Detailed descriptions of the same components may be omitted.

Figure 3A:
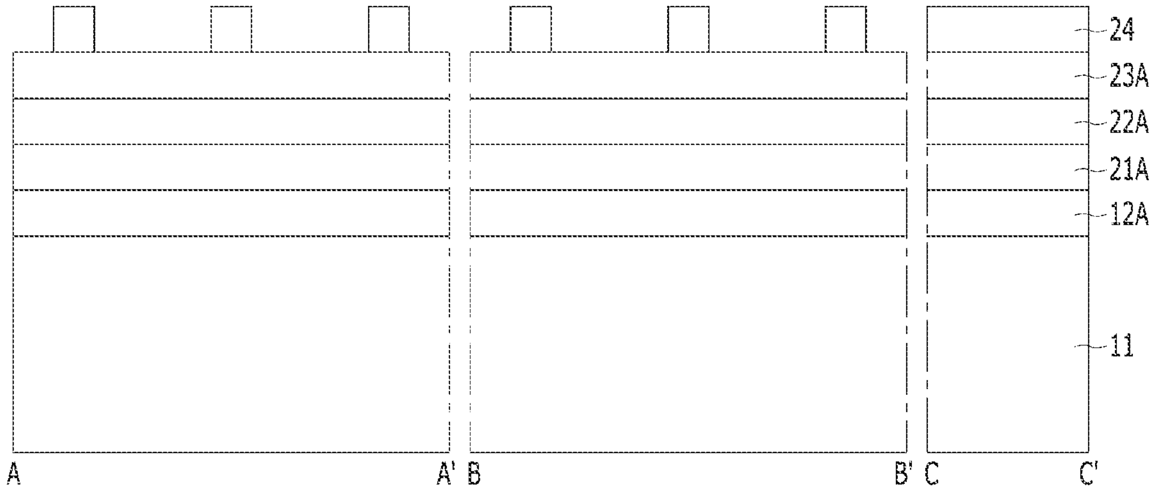
FIGS. 3A to 3L are cross-sectional views illustrating a method for fabricating a semiconductor device according to an embodiment of the present invention.

As shown in FIG. 3A, a fin material layer 12A, a first sacrificial layer 21A, a second sacrificial layer 22A, and a third sacrificial layer 23A may be formed on a substrate 11 sequentially, in the recited order. A mask pattern 24 may be formed on the third sacrificial layer 23A.

The substrate 11 may include a semiconductor substrate such as a silicon substrate.

The fin material layer 12A may include a semiconductor material such as silicon germanium (SiGe) or silicon carbide (SiC). For example, the substrate 11 and the fin material layer 12A of the PMOS region may include a germanium-based stacked structure selected from among SiGe/Si, Ge/Si, and high concentration SiGe/low concentration SiGe, or a tin-based stacked structure such as GeSn/GE or Sn/Ge.

The first sacrificial layer 21A, the second sacrificial layer 22A, and the third sacrificial layer 23A may be formed of materials having different etch selectivity, respectively. The first sacrificial layer 21A, the second sacrificial layer 22A, and the third sacrificial layer 23A may be formed of an insulating material. The first sacrificial layer 21A, the second sacrificial layer 22A, and the third sacrificial layer 23A may include, for example, a stacked structure of silicon oxide, silicon nitride, and silicon oxycarbide (SiOC). The first sacrificial layer 21A may be a protective layer for protecting the fin material layer 12A. The second sacrificial layer 22A may serve as an etching mask for the first sacrificial layer 21A. The third sacrificial layer 23A may serve as an etching mask for the second sacrificial layer 22A. The thicknesses of the first to third sacrificial layers 21A to 23A may not be the same. The first to third sacrificial layers 21A to 23A may be adjusted to a minimum thickness so that the deposition film uniformity is not deteriorated for accuracy of subsequent fine patterning. The present disclosure is not limited thereto, and the thicknesses of the first to third sacrificial layers 21A to 23A may be adjusted as may be needed.

The first mask pattern 24 may be of a photoresist pattern. The first mask pattern 24 may be patterned in a line-shape extending in the first direction X (refer to FIG. 2).

Figure 3B:
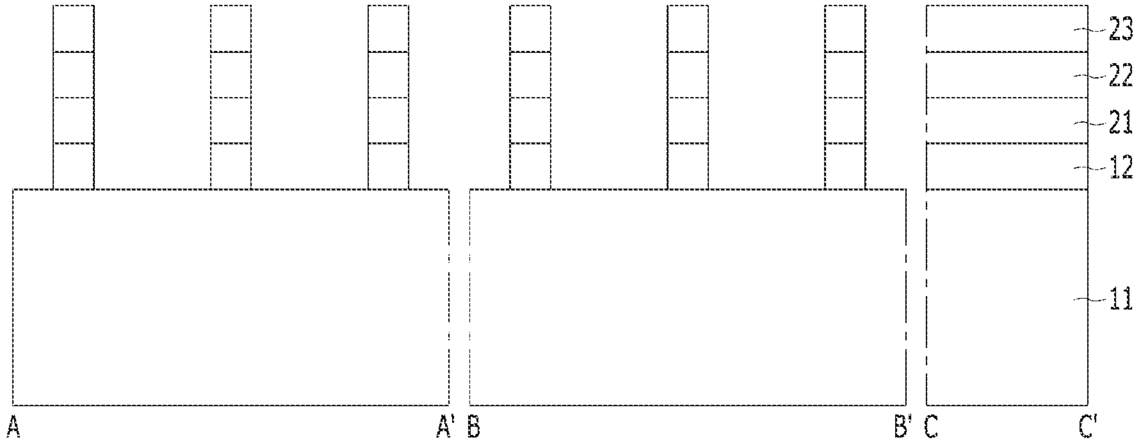

As shown in FIG. 3B, the third sacrificial layer 23A (refer to FIG. 3A), the second sacrificial layer 22A (refer to FIG. 3A), the first sacrificial layer 21A (refer to FIG. 3A), and the fin material layer 12A (refer to FIG. 3A) may be sequentially etched using the first mask pattern 24 (refer to FIG. 3A). The third sacrificial layer 23A may be etched using the first mask pattern 24 as an etching mask, the second sacrificial layer 22A may be etched using an etched third sacrificial layer as an etching mask, and the first sacrificial layer 21A may be etched using an etched second sacrificial layer as an etching mask.

Accordingly, a fin 12 protruding from the substrate 11 may be formed. A stacked structure of first to third sacrificial patterns 21 to 23 may be formed on the fin 12.

The first mask pattern 24 (refer to FIG. 3A) may be removed in an etching process for forming the third to first sacrificial patterns 23 to 21. In another embodiment, the first mask pattern 24 (refer to FIG. 3A) may be removed through a strip process after forming the third sacrificial pattern 23. In another embodiment, the first mask pattern 24 (refer to FIG. 3A) may be removed through a strip process after the fin 12 and the first to third sacrificial patterns 21, 22, and 23 are all formed.

Figure 3C:
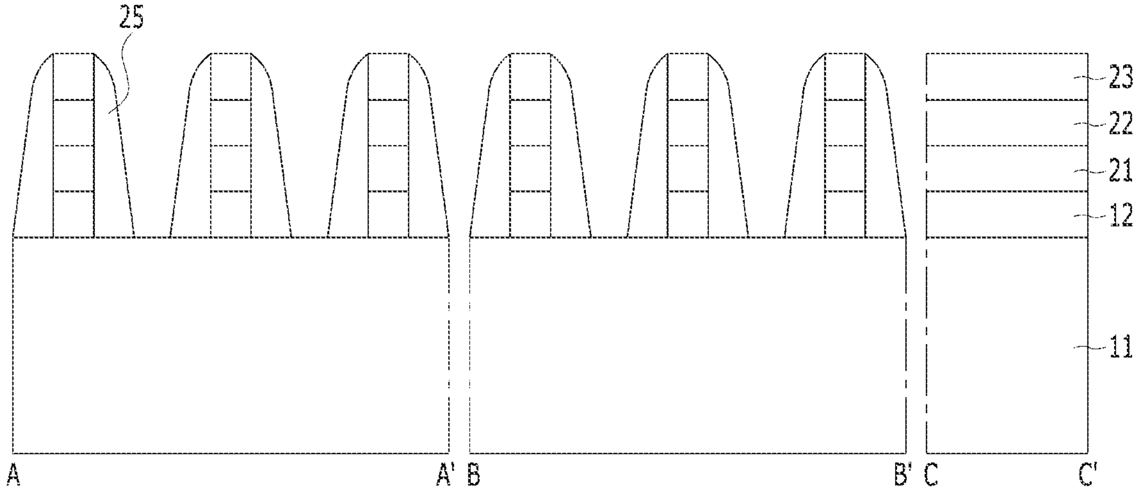

As shown in FIG. 3C, a sacrificial spacer 25 may be formed on both sidewalls of the stacked structure of the fin 12 and the first to third sacrificial patterns 21 to 23.

The sacrificial spacer 25 may serve as an etching mask for etching the substrate 11. The sacrificial spacer 25 may include a material having an etch selectivity with respect to the third sacrificial pattern 23. The sacrificial spacer 25 may include an insulating material. The sacrificial spacer 25 may include nitride and oxide. The sacrificial spacer 25 may include, for example, an insulating material such as $SiO_2$, SiON, SiBN, or SiBCN.

To form the sacrificial spacer 25, a spacer etching process may be performed after forming an insulating material covering the substrate 11 including the fin and the first to third sacrificial patterns 21 to 23.

The substrate 11 may be exposed between the adjacent sacrificial spacers 25. The substrate 11 exposed between the adjacent sacrificial spacers 25 may define a device separation region. The substrate 11 exposed between the adjacent sacrificial spacers 25 may have an extremely scaled critical dimension. The substrate 11 exposed between the adjacent sacrificial spacers 25 may have a narrower width than the sacrificial spacer 25 and the substrate 11 covered with a stacked structure.

Figure 3D:
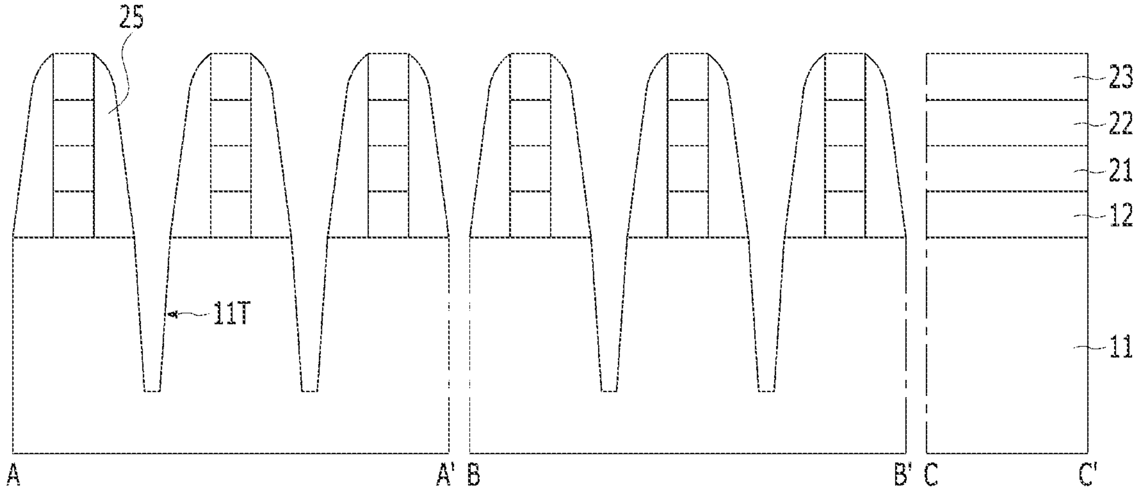

As shown in FIG. 3D, a trench 11T may be formed by etching the substrate 11 by using the stacked structure of the fin 12 and the first to third sacrificial patterns 21 to 23, and the sacrificial spacer 25 as an etching mask. The trench 11T may have a line shape extending in the first direction X on the substrate 11. The trenches 11T may have line shapes spaced apart in the second direction Y. The width of the trench 11T may be formed to be narrower than the width of the substrate 11 between adjacent trenches 11T.

The trench 11T may be formed to have a slope of a positive profile in which the width of the upper part is wider than the width of the lower part. In another embodiment, the trench 11T may be formed through polymer passivation to have a vertical profile in which the upper width and the lower width of the trench 11T are the same, or a negative profile in which the upper width of the trench 11T is narrower than the lower width.

The width of the trench 11T may be adjusted to have a critical dimension such that both sidewalls of the trench 11T may not contact each other even when the substrate 11 expands due to a thermal process performed during a semiconductor process.

An active region may be defined by the trenches 11T. Fin bodies 14 spaced apart from each other by the trenches 11T may be defined. The active region may include the fin bodies 14 and the fins 12 on the fin bodies 14.

Figure 3E:
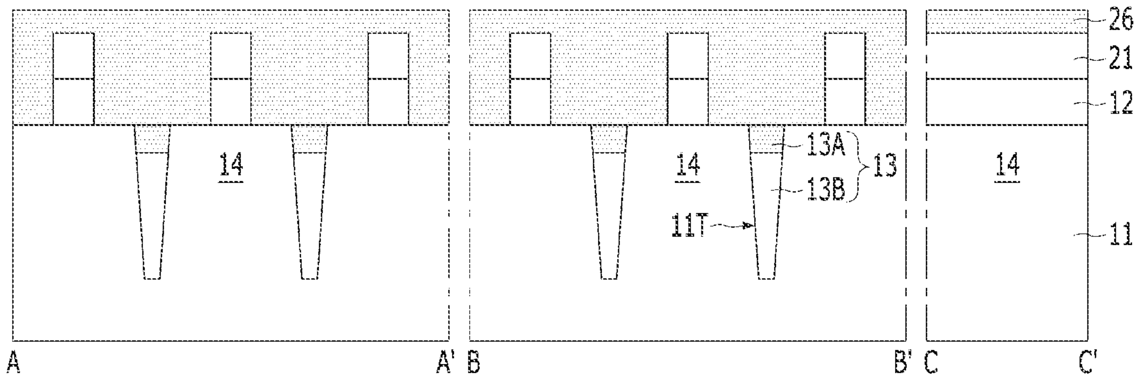

As shown in FIG. 3E, the sacrificial spacer 25 (refer to FIG. 3D) may be removed. The sacrificial spacer 25 may be removed by wet etching. The third and second sacrificial patterns 23 and 22 may also be removed at the time when the sacrificial spacer 25 is removed.

Subsequently, an oxide layer 26 may be formed on an upper portion of the substrate 11 including the fin 12 and the first sacrificial pattern 21. The oxide layer 26 may include silicon oxide. The oxide layer 26 may include silicon oxide having a poor step coverage. The oxide layer 26 may include a tetraethyl orthosilicate (TEOS)-based oxide. In another embodiment, the oxide layer 26 may include undoped silicate glass (USG) or high density plasma (HDP) oxide. In another embodiment, the oxide layer 26 may include silicon oxide excluding spin on dielectric (SOD) and high aspect ratio process (HARP) oxides.

The oxide layer 26 may be gap-filled on the trench 11T. The oxide that gap-fills the upper portion of the trench 11T may serve as the capping layer 13A of the isolation layer 13. An air gap 13B may be formed under the capping layer 13A. That is, a isolation layer 13 including the capping layer 13A and the air gap 13B may be formed in the trench 11T.

The fin bodies 14 may be defined by the isolation layers 13. The fin bodies 14 may have linear shape extending in the first direction X and may be spaced apart from each other by the isolation layers 13 in the second direction Y.

Figure 3F:
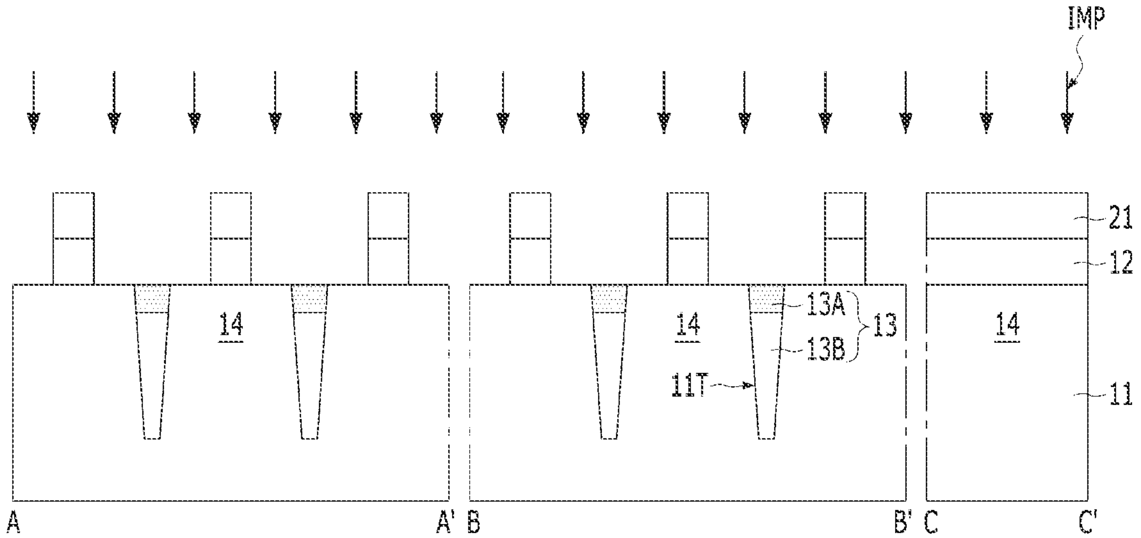

As shown in FIG. 3F, the oxide layer 26 (refer to FIG. 3E) may be removed. The oxide layer 26 may be removed by wet etching. Wet etching may be performed through a dip out process.

Subsequently, an ion implantation process IMP may be performed. The ion implantation process IMP may be an impurity doping process for forming a channel and a well in the fin body 14. The ion implantation processes IMP for forming a well and a channel may be separately performed. The ion implantation process for forming a channel may be performed through the counter doping to lower the threshold voltage Vt.

Before performing the ion implantation process IMP, a barrier mask entirely covering the substrate 11, the substrate 11 including the fin 12 and the first sacrificial pattern 21, may be formed. The barrier mask may serve as a barrier for preventing surface damage of the substrate 11 during the ion implantation process IMP. In another embodiment, the first sacrificial pattern 21 may be removed at the time when the oxide layer 26 (refer to FIG. 3E) is removed. In another embodiment, the first sacrificial pattern 21 may be removed and the barrier mask entirely covering the substrate 11, the substrate 11 including the fin 12, may be formed before performing the ion implantation process IMP.

Figure 3G:
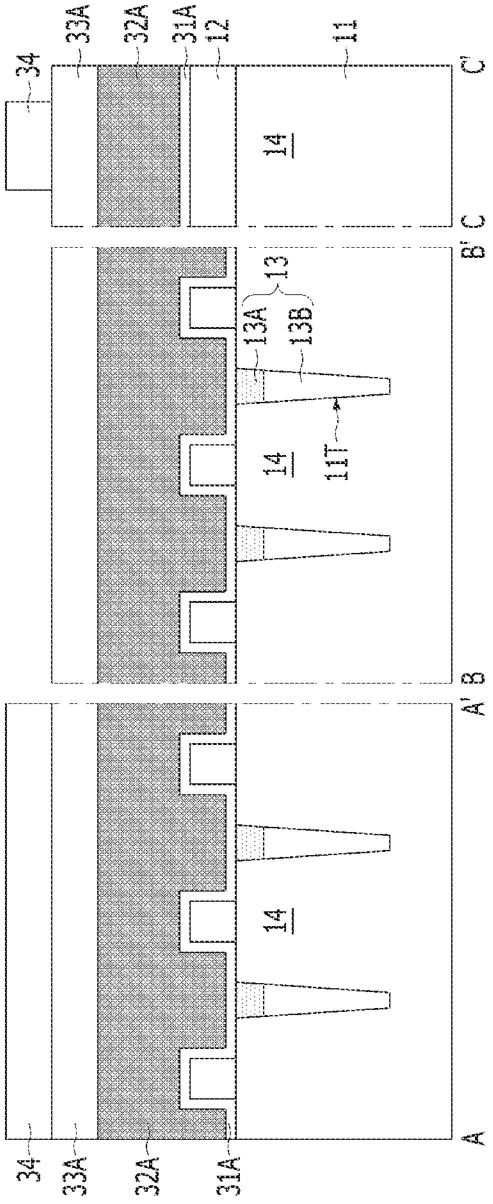

As shown in FIG. 3G, an etch stop layer 31A covering the entire substrate 11 including the fins 12, a dummy gate layer 32A, and a dummy mask layer 33A may be sequentially formed over the substrate 11. The etch stop layer 31A may include a material having an etch selectivity with respect to the dummy gate layer 32A. The etch stop layer 31A may include, for example, silicon oxide. The dummy gate layer 32A may include, for example, polysilicon. The dummy mask layer 33A may include a material having an etch selectivity with respect to the dummy gate layer 32A and the etch stop layer 31A. The dummy mask layer 33A may include, for example, silicon nitride.

The second mask pattern 34 may be formed on the dummy mask pattern layer 33A. The second mask pattern 34 may be patterned in a line shape extending in the second direction Y. The second mask pattern 34 may be of a photoresist pattern.

Figure 3H:
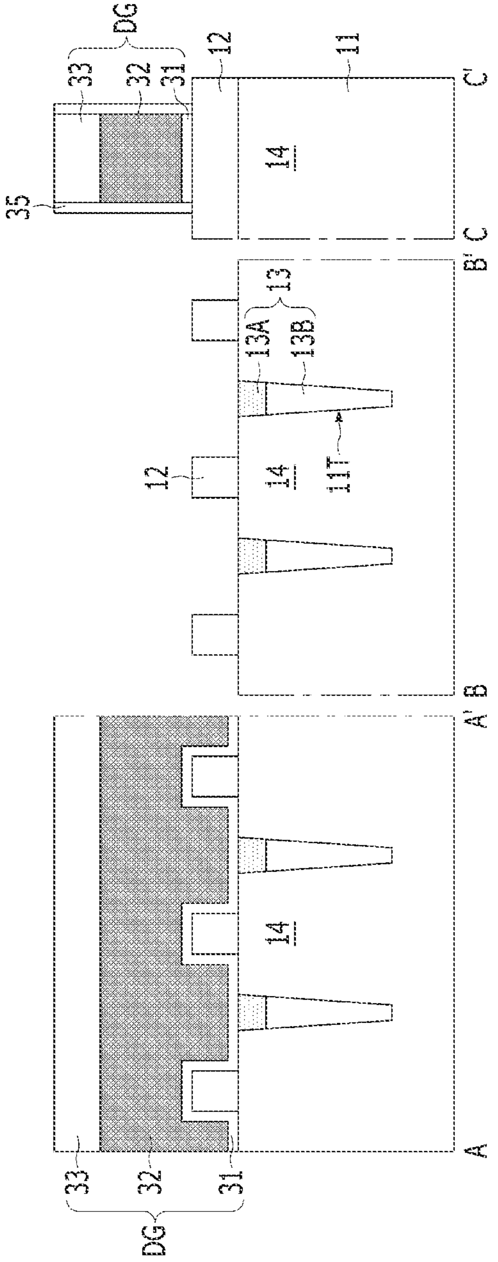

As shown in FIG. 3H, the dummy mask layer 33A (refer to FIG. 3G) may be etched using the second mask pattern 34 (refer to FIG. 3G). Accordingly, a dummy mask pattern 33 may be formed. The second mask pattern 34 (refer to FIG. 3G) may be removed during an etching process for forming the dummy mask pattern 33. In another embodiment, the second mask pattern 34 (refer to FIG. 3G) may be removed during a strip process after forming the dummy mask pattern 33.

Subsequently, the dummy mask pattern 33 may be used as an etching mask for sequentially etching the dummy gate layer 32A (refer to FIG. 3G) and the etch stop layer 31A (refer to FIG. 3G). Accordingly, a stacked structure of the etch stop layer 31, a dummy gate pattern 32 and a dummy mask pattern 33 may be formed.

Subsequently, a gate spacer 35 may be formed on sidewalls of the stacked structure of the etch stop pattern 31, the dummy gate pattern 32, and the dummy mask pattern 33. The gate spacer 35 may include an insulating material. The gate spacer 35 may include, for example, silicon nitride. The gate spacer 35 may be formed by forming a spacer material covering the entire substrate 11 including the stacked structure of the etch stop pattern 31, the dummy gate pattern 32, and the dummy mask pattern 33, and then performing a spacer etching process.

The stacked structure of the etch stop pattern 31, the dummy gate pattern 32, and the dummy mask pattern 33, and the gate spacer 35 formed on the sidewalls of the stacked structure may be referred to as a 'dummy gate structure DG'. The dummy gate structure DG may be a dummy pattern for a replacement metal gate (RMG) process.

The dummy gate structure DG may extend in the second direction Y and have a line shape crossing the fin bodies 14, the fins 12, and the isolation layers 13. Both sides of the dummy gate structure DG may be etched to expose the fins 12 and the substrate 11 as shown in a cross-sectional view of FIG. 3H taken along the line B-B'.

Figure 3I:
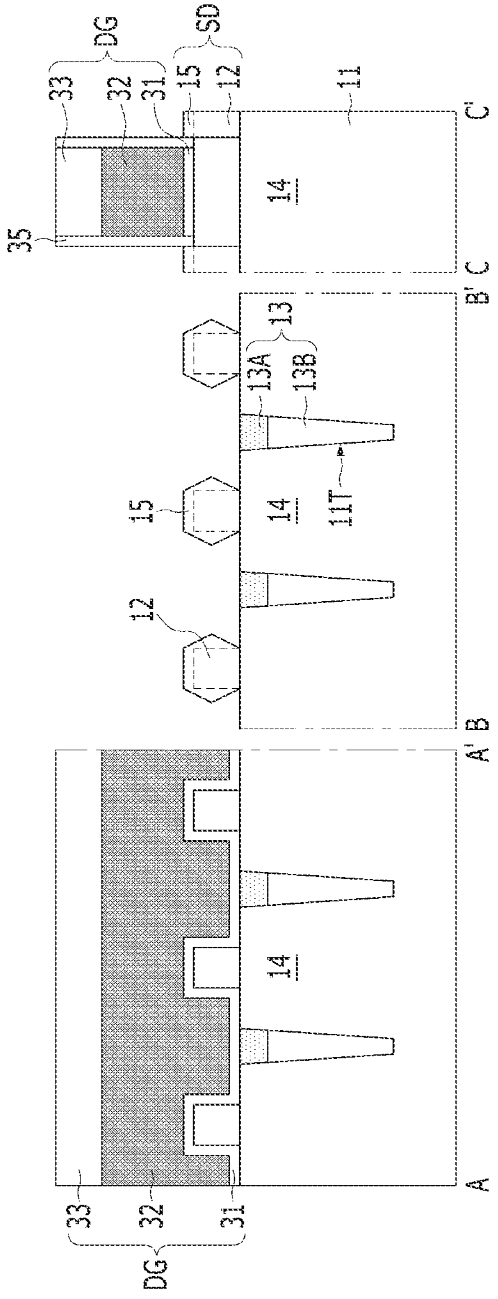

As shown in FIG. 3I, the source/drain region SD may be formed on both sides of the dummy gate structure DG. The source/drain region SD may include the fin 12 exposed on both sides of the dummy gate structure DG and the epitaxial layer 15 covering the fin 12. The epitaxial layer 15 may be grown from the fin 12. The epitaxial layer 15 may be formed by performing a selective epitaxial growth process using the surface of the fin 12 as a seed. The epitaxial layer 15 may include, for example, silicon germanium (SiGe) or silicon carbide (SiC).

The process of forming the source/drain region SD may include a process of doping the source/drain region SD with impurities simultaneously with or after the selective epitaxial growth process. The process of doping impurities may be performed to improve electrical characteristics of a transistor including the source/drain region SD. When the transistor is an N-type, the impurity may be, for example, one of phosphorus (P), As, or Sb. When the transistor is a P-type, the impurity may be, for example, one of B, BF2 or Ga. The present disclosure is not limited thereto, and may include the fin 12 made of a semiconductor material capable of applying sufficient stress to each of the N-type or P-type transistors. In addition, the impurities doped in the source/drain region SD of the present embodiment are not limited thereto, and may include appropriate impurities capable of improving the mobility characteristics of a device.

Figure 3J:
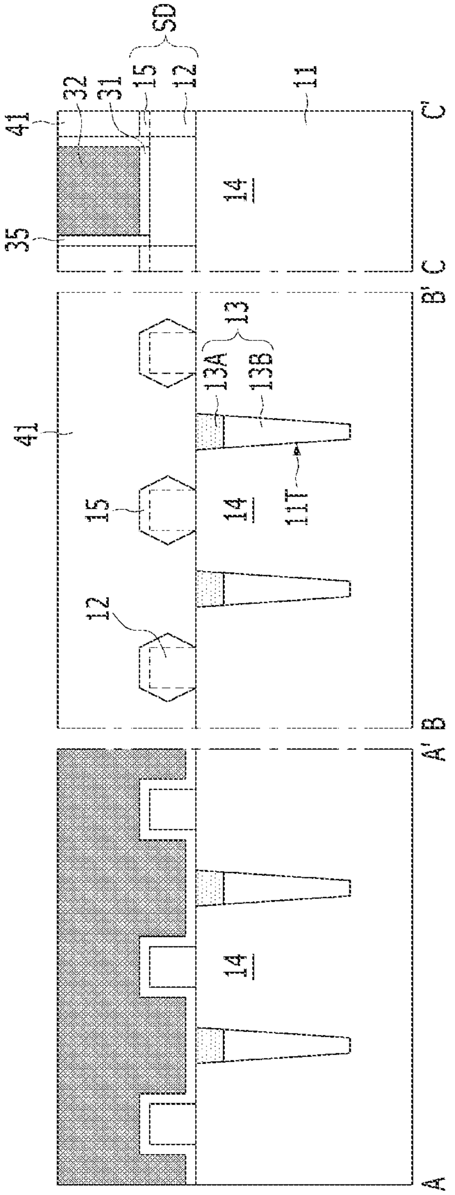

As shown in FIG. 3J, an interlayer dielectric layer 41 may be formed on the source/drain region SD formed on the substrate 11. The process of forming the interlayer dielectric layer 41 may include the process of forming an insulating layer covering the source/drain region SD and the dummy gate structure DG on the substrate 11, and the process of planarizing the insulating layer until the upper surface of the dummy gate structure DG is exposed. The dummy mask pattern 33 (refer to FIG. 3I) may be removed through a planarization process. The interlayer dielectric layer 41 may include at least one of silicon oxide, silicon nitride, silicon oxynitride, and a low dielectric material.

Figure 3K:
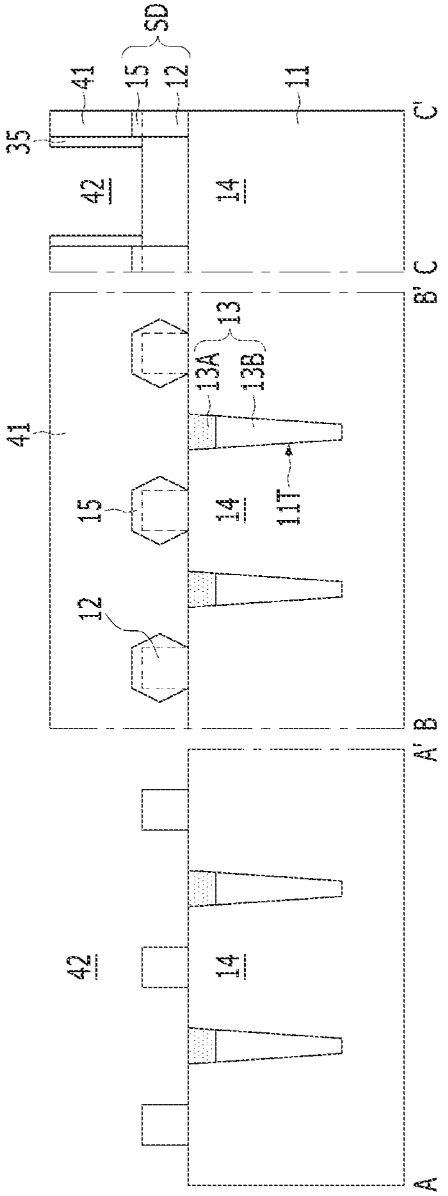

As shown in FIG. 3K, a gap region 42 may be formed in the gate spacer 35 by removing the dummy gate pattern 32 (refer to FIG. 3J) and the etch stop pattern 31 (refer to FIG. 3J). The gap region 42 may be an empty space defined by the gate spacers 35. The upper surface of the fin 12 may be exposed by the gap region 42.

The process of forming the gap region 42 may include a process of etching the dummy gate pattern 32 (refer to FIG. 3J) under an etching condition having an etch selectivity with respect to the gate spacer 35, the interlayer dielectric layer 41, and the etch stop pattern 31 (refer to FIG. 3J). Subsequently, the process of forming the gap region 42 may include a process of exposing the upper surface of the fin 12 by removing the etch stop pattern 31 (refer to FIG. 3J).

Figure 3L:
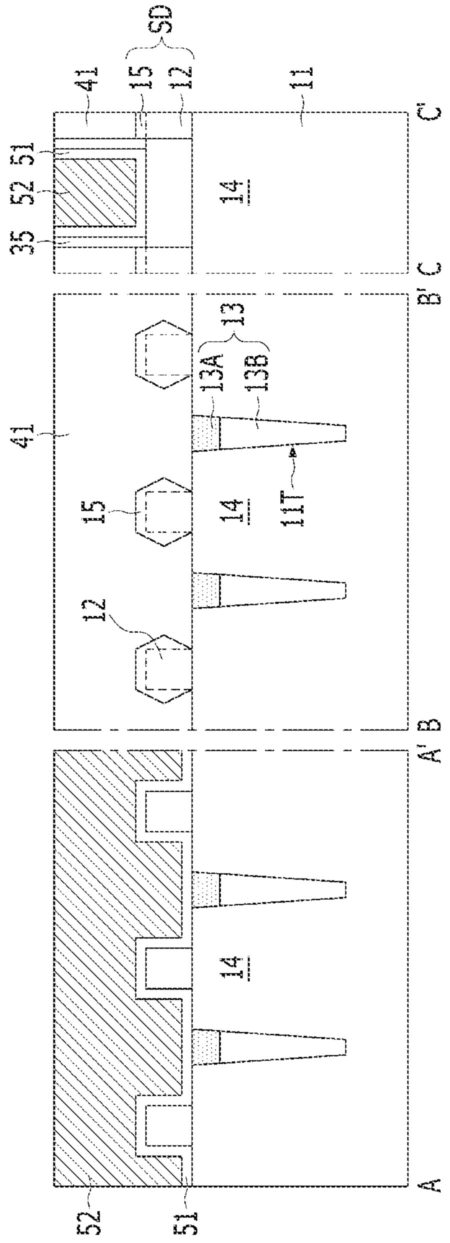

Subsequently, as shown in FIG. 3L, a gate dielectric layer 51 and a gate electrode 52 filling the gap region 42 (refer to FIG. 3K) may be formed.

Specifically, the gate dielectric layer 51 may be formed to conformally fill a portion of the gap region 42 (refer to FIG. 3K). The gate dielectric layer 51 may be formed to cover the upper surface of the fin 12. The gate dielectric layer 51 may include a high-k material. The gate dielectric layer 51 may be formed by, for example, an atomic layer deposition process. Subsequently, the gate electrode 52 may be formed on the gate dielectric layer 51 to fill remainder of the gap region 42 (refer to FIG. 3K). The gate electrode 52 may include a conductive material. The gate electrode 52 may be formed as a single layer or multiple layers. The gate electrode 52 may include a stacked structure of metal nitride and a metal layer. The gate dielectric layer 51 may extend along the bottom and side surfaces of the gate electrode 52 and may be interposed between the gate electrode 52 and the gate spacer 35.

As described above, in the present embodiment, by minimizing the insulating material filling the isolation layer 13, the application of unnecessary stress to the substrate 11, more specifically to the fin body 14, from the insulating material may be minimized. In addition, by forming the width of the isolation layer 13 to be narrower than that of the fin body 14, the overall volume of the fin body 14 may be increased. Accordingly, there is an effect of dispersing the stress applied to the fin body 14 from the capping layer 13A of the isolation layer 13.

In addition, in this embodiment, the fin 12 may be formed on the fin body 14 through a separate deposition process, so that only the fin 12 may protrude above the substrate 11. Accordingly, it is possible to minimize the effect on the fin body 14 and the fin 12 resulting from different stress characteristics of the fin body 14 and the fin 12 which are made of different materials. That is, it is possible to minimize a problem in which the stress of the fin 12 acting as the source/drain region SD is relieved by the material of the fin body 14 or impurities that are unnecessarily doped in the fin body 14.

Accordingly, in the present embodiment, a high-performance device can be implemented by applying sufficient stress required to improve device performance.

Although the disclosure is shown and described with reference to specific embodiments thereof, the present invention is not limited thereto. It will readily be appreciated by one of ordinary skill in the art that various changes or modifications may be made thereto without departing from the scope of the disclosure.

What is claimed is:

1. A method for fabricating a semiconductor device, the method comprising:

forming a plurality of stacked structures spaced apart from each other over a substrate and sequentially stacking fins and sacrificial patterns;

forming sacrificial spacers on both sides of each of the stacked structures;

etching an exposed portion of the substrate between adjacent sacrificial spacers to form a plurality of dividing trenches extending in a first direction and spaced apart in a second direction perpendicular to the first direction, the dividing trench defining an active region including a fin body having a width greater than a width of the fins and the fins on the fin body; and forming an isolation layer in each of the plurality of dividing trenches, the isolation layer including a capping layer locally gap-filling only an upper portion of the dividing trench and an air gap formed in the dividing trench below the capping layer.

2. The method according to claim 1, wherein the forming a plurality of stacked structures includes:

sequentially forming a fin material layer and first to third sacrificial layers over the substrate;

forming a mask pattern over the third sacrifice layer; and sequentially etching the third sacrifice layer to the first sacrifice layer and the fin material layer using the mask pattern.

3. The method according to claim 1, wherein the fin includes a semiconductor material.

4. The method according to claim 1, wherein the sacrificial pattern includes an insulating material.

5. The method according to claim 1, wherein the capping layer includes silicon oxide having a bad step coverage.

6. The method according to claim 1, wherein the capping layer is one selected from USG oxide, TEOS oxide, and HDP oxide.

7. The method according to claim 1, wherein each of the sacrificial spacers includes a material having an etch selectivity with respect to the substrate.

8. The method according to claim 1, wherein each of the sacrificial spacers includes nitride or oxide.

9. The method according to claim 1, wherein each of the sacrificial spacers includes any one of insulating materials selected from SiO2, SiON, SiBN, and SiBCN.

10. The method according to claim 1, wherein each of the isolation layers has a width narrower than that of the fin body.

11. The method according to claim 1, wherein an upper surface of the fin body and an upper surface of each of the isolation layers are at a same level.

12. The method according to claim 1, wherein an upper surface of the fin is at a level higher than upper surfaces of the isolation layers.

13. The method according to claim 1, wherein the fin body and the fin are made of different materials.

14. The method according to claim 1, wherein a stacked structure of the fin/the fin body is one of stacked structures of semiconductor materials among SiGe/Si, Ge/Si, high concentration SiGe/low concentration SiGe, GeSn/Ge, and Sn/Ge.

15. The method according to claim 1, further comprising:

forming a gate structure partially covering the active region and the isolation layers, and extending in the second direction; and forming a source/drain region covering the fin on both sides of the gate structure.

16. The method according to claim 1, wherein the source/drain region includes the fin on both sides of the gate structure and an epitaxial layer grown from the fin.

17. A method for fabricating a semiconductor device, the method comprising:

forming a stacked structure of a fin and a sacrificial pattern on a substrate;

forming sacrificial spacers on both sides of the stacked structure;

forming a dividing trench by etching an exposed portion of the substrate between the sacrificial spacers, which are consecutively disposed; and forming an isolation layer in the dividing trench, the isolation layer including a capping layer locally gap-filling only an upper portion of the dividing trench and an air gap formed in the dividing trench below the capping layer.

18. The method according to claim 1, wherein forming sacrificial spacers on both sides of each of the stacked structures comprise:

forming an insulating material over the plurality of stacked structures and the substrate; and performing a spacer etch process on the insulating material.

19. The method according to claim 1, wherein a width of a bottom surface of the fin is narrower than a width of a top surface of the fin body.

* * * * *